US009822450B2

(12) United States Patent
Nakazawa et al.

(10) Patent No.: US 9,822,450 B2
(45) Date of Patent: Nov. 21, 2017

(54) SUBSTRATE PROCESSING APPARATUS

(71) Applicant: CANON ANELVA CORPORATION, Kawasaki-shi (JP)

(72) Inventors: Toshikazu Nakazawa, Kawasaki (JP); Norihito Tsukamoto, Kawasaki (JP); Keisuke Ueda, Kawasaki (JP); Eiji Ozaki, Kawasaki (JP)

(73) Assignee: Canon Anelva Corporation, Kawasaki-Shi (JP)

( * ) Notice: Subject to any disclaimer, the term of this patent is extended or adjusted under 35 U.S.C. 154(b) by 645 days.

(21) Appl. No.: 14/295,438

(22) Filed: Jun. 4, 2014

(65) Prior Publication Data

US 2014/0261182 A1    Sep. 18, 2014

Related U.S. Application Data

(63) Continuation of application No. PCT/JP2012/008132, filed on Dec. 19, 2012.

(30) Foreign Application Priority Data

Dec. 22, 2011 (JP) ................................. 2011-281015

(51) Int. Cl.
*C23C 16/455* (2006.01)
*C23C 16/44* (2006.01)
*C23C 14/56* (2006.01)

(52) U.S. Cl.
CPC ...... *C23C 16/45589* (2013.01); *C23C 14/564* (2013.01); *C23C 16/4401* (2013.01)

(58) Field of Classification Search
CPC .................... C23C 16/45589; C23C 14/564; C23C 16/4401
See application file for complete search history.

(56) References Cited

U.S. PATENT DOCUMENTS 6,241,477 B1 * 6/2001 Brezoczky ............ C23C 14/564
417/48
9,127,355 B2 * 9/2015 Nakazawa ............ C23C 14/345
(Continued)

FOREIGN PATENT DOCUMENTS

JP       5-117867 A    5/1993
JP       5-247639 A    9/1993
(Continued)

OTHER PUBLICATIONS

International Search Report issued in PCT/JP2012/008132, dated Mar. 19, 2013 (3 pages).

*Primary Examiner* — Jeffrie R Lund
(74) *Attorney, Agent, or Firm* — Fitzpatrick, Cella, Harper & Scinto

(57) ABSTRACT

The present invention provides a vacuum processing apparatus capable of reducing attachment of particles generated in a processing space to an inner wall of a chamber, and of easily adjusting pressure in the processing space while introducing a gas into the processing space at a desired flow rate. A vacuum processing apparatus according to one embodiment includes: a container; a gas exhaust portion; a substrate holder configured to retain a substrate; a shield provided to surround the substrate holder and dividing an inside of the container into a processing space and an outside space; a gas introducing portion; a plasma generating portion; and an exhaust portion provided to the shield having a communication path through which the processing space and the outside space communicate, wherein at least part of the communication path is hidden from a region where the plasma generating portion generates the plasma.

19 Claims, 14 Drawing Sheets

(56) References Cited

U.S. PATENT DOCUMENTS

| | | | |
|---|---|---|---|
| 9,689,070 B2* | 6/2017 | Rasheed | C23C 14/50 |
| 2003/0010452 A1* | 1/2003 | Park | C23C 16/45565 |
| | | | 156/345.33 |
| 2005/0006222 A1* | 1/2005 | Ding | C23C 14/358 |
| | | | 204/192.1 |
| 2007/0283884 A1* | 12/2007 | Tiller | C23C 14/564 |
| | | | 118/715 |
| 2008/0141942 A1* | 6/2008 | Brown | C23C 14/564 |
| | | | 118/723 R |
| 2008/0257263 A1* | 10/2008 | Pavloff | C22C 21/00 |
| | | | 118/723 R |
| 2008/0305634 A1* | 12/2008 | Igarashi | C23C 14/564 |
| | | | 438/688 |
| 2009/0260982 A1* | 10/2009 | Riker | C23C 14/34 |
| | | | 204/298.11 |
| 2010/0055298 A1* | 3/2010 | Sommers | C23C 14/564 |
| | | | 427/58 |
| 2010/0206715 A1* | 8/2010 | Hiromi | C23C 14/3464 |
| | | | 204/192.12 |
| 2010/0224482 A1* | 9/2010 | Yamaguchi | C23C 14/0036 |
| | | | 204/192.15 |
| 2011/0036709 A1* | 2/2011 | Hawrylchak | C23C 14/34 |
| | | | 204/298.11 |
| 2011/0117753 A1 | 5/2011 | Doi et al. | |
| 2011/0209989 A1* | 9/2011 | Li | C23C 14/34 |
| | | | 204/192.22 |
| 2011/0278165 A1* | 11/2011 | Rasheed | C23C 14/35 |
| | | | 204/298.11 |
| 2012/0031337 A1* | 2/2012 | Shiina | C23C 14/325 |
| | | | 118/723 R |
| 2012/0103257 A1* | 5/2012 | Rasheed | C23C 14/50 |
| | | | 118/715 |
| 2012/0152736 A1 | 6/2012 | Yamaguchi et al. | |
| 2012/0234672 A1 | 9/2012 | Yamaguchi et al. | |
| 2012/0321786 A1* | 12/2012 | Satitpunwaycha | C23C 16/45565 |
| | | | 427/252 |
| 2013/0161187 A1 | 6/2013 | Nakazawa et al. | |
| 2013/0277203 A1* | 10/2013 | Rasheed | C23C 14/34 |
| | | | 204/192.1 |
| 2013/0334038 A1* | 12/2013 | Riker | C23C 14/564 |
| | | | 204/298.11 |
| 2014/0261182 A1* | 9/2014 | Nakazawa | C23C 16/45589 |
| | | | 118/723 R |
| 2017/0029941 A1* | 2/2017 | Allen | C23C 14/564 |

FOREIGN PATENT DOCUMENTS

| | | |
|---|---|---|
| JP | 2001-267304 A | 9/2001 |
| JP | 2006-307291 A | 11/2006 |
| JP | 2010-168611 A | 8/2010 |
| JP | 2010-251604 A | 11/2010 |
| JP | 2011-132580 A | 7/2011 |
| JP | 2012-132064 A | 7/2012 |
| WO | 2011/016223 A1 | 2/2011 |
| WO | 2011/077653 A1 | 6/2011 |

* cited by examiner

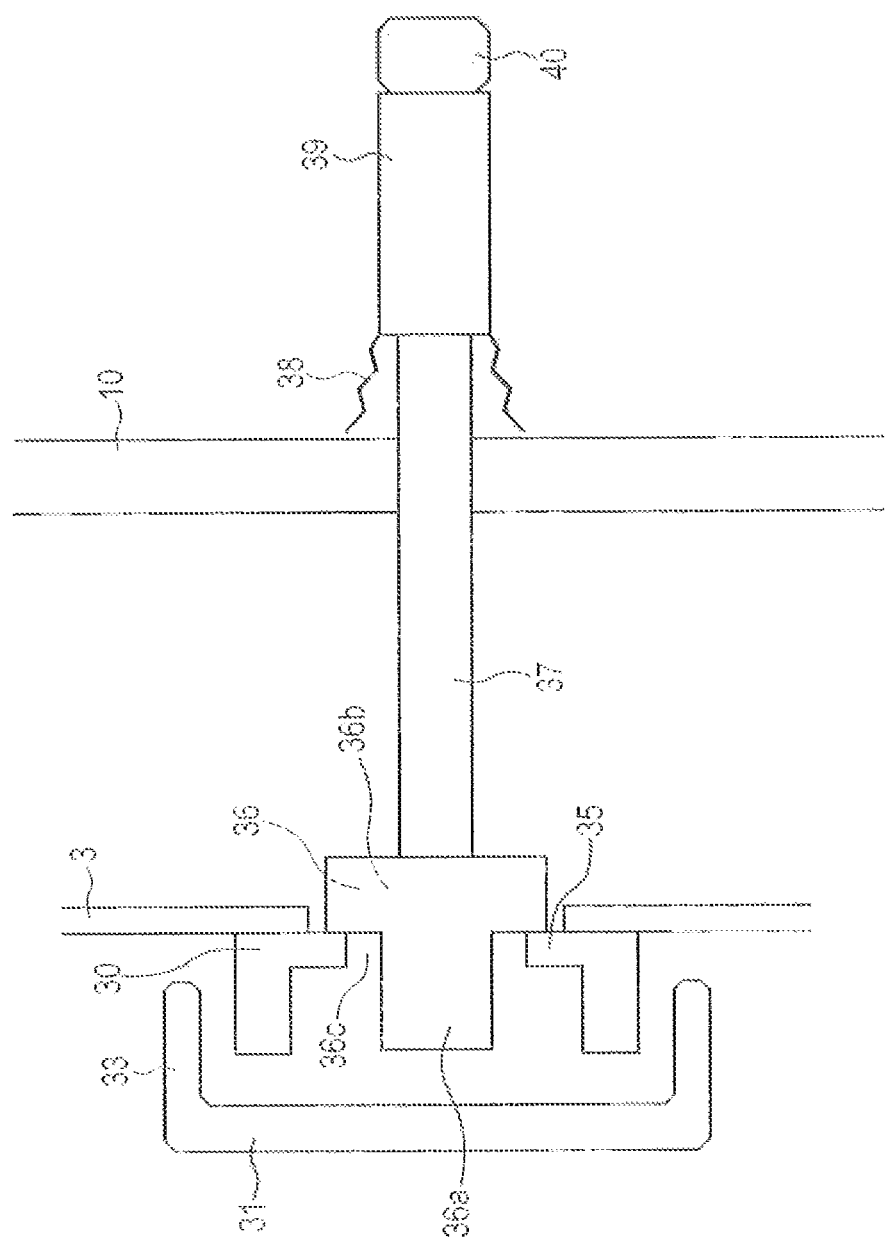

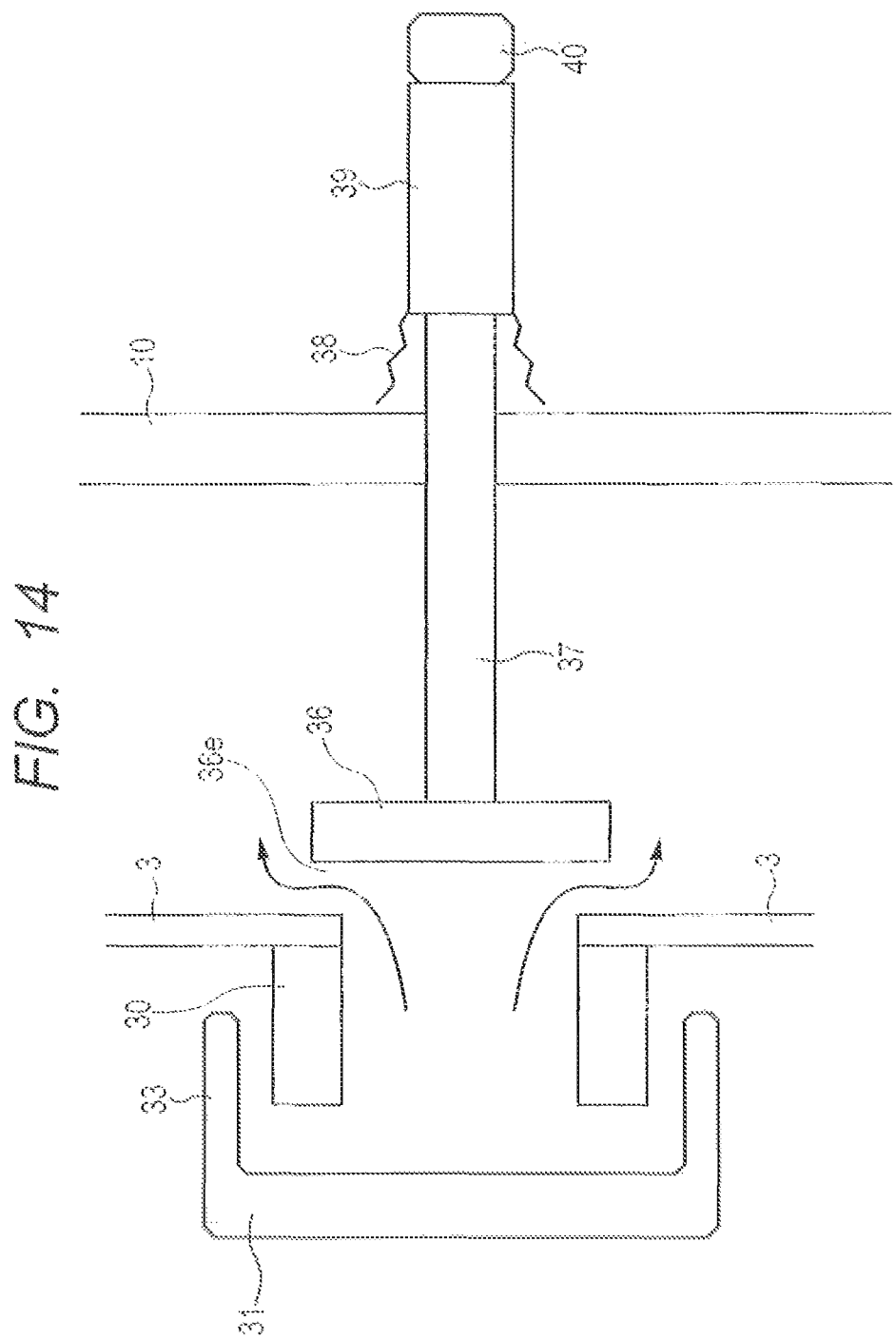

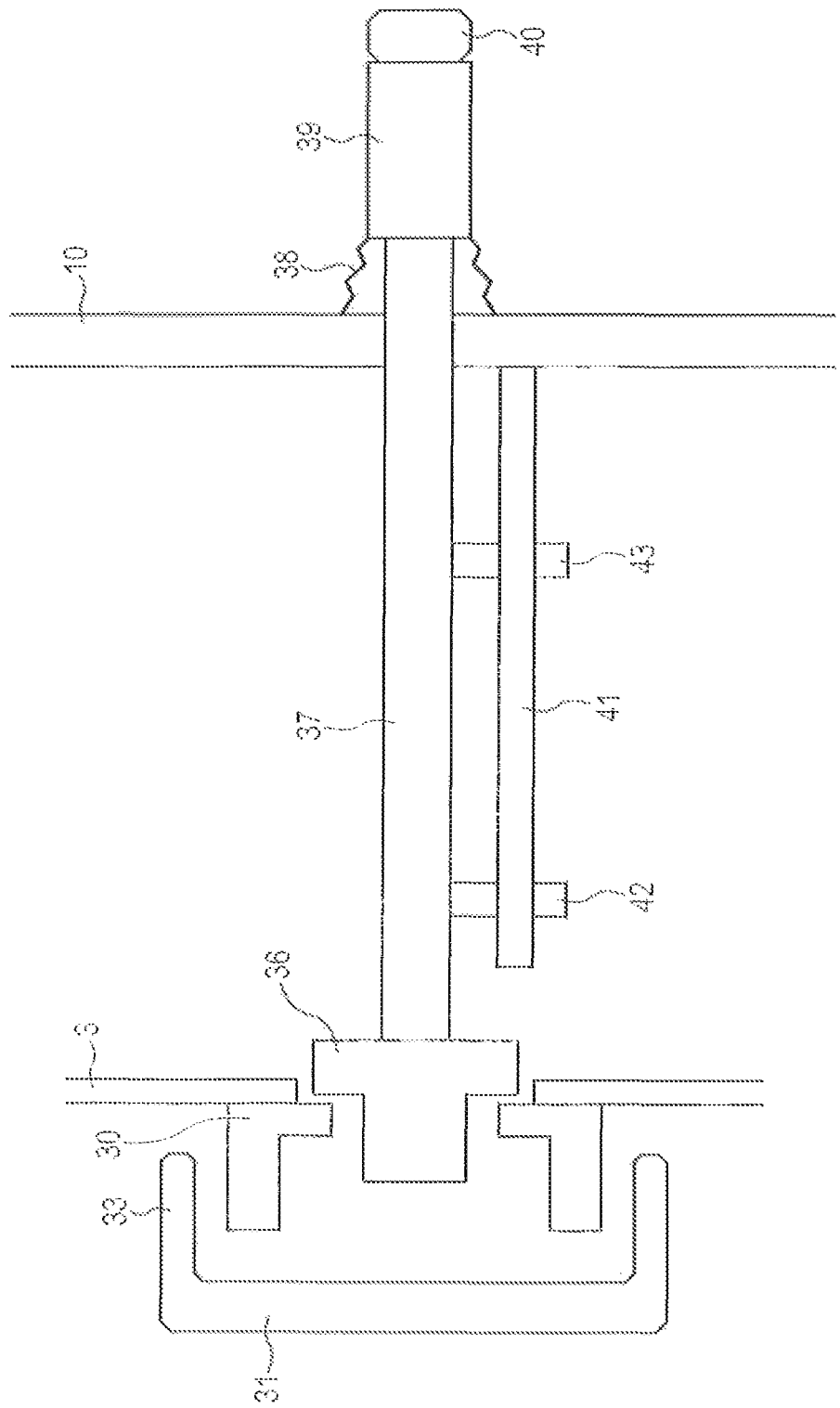

SUBSTRATE PROCESSING APPARATUS

CROSS-REFERENCES TO RELATED APPLICATIONS

This application is a continuation application of International Application No. PCT/JP2012/008132, filed Dec. 19, 2012, which claims the benefit of Japanese Patent Application No. 2011-281015, filed Dec. 22, 2011. The contents of the aforementioned applications are incorporated herein by reference in their entireties.

TECHNICAL FIELD

The present invention relates to a substrate processing apparatus, and more specifically, relates to a substrate processing apparatus that forms a film by introducing a predetermined gas into a processing space.

BACKGROUND ART

Vacuum processing apparatuses that perform various kinds of substrate processing under vacuum, such as film formation and etching, are widely used. As shown in Patent Document 1, shields are provided on an inner wall of a vacuum processing apparatus to prevent a film-forming substance which is also deposited on a portion other than a substrate during film formation or an etching substance dispersed during etching (these substances are also collectively referred to simply as deposits hereinbelow) from being attached to the inner wall of a chamber. A substrate processing space (also referred to simply as a processing space) should desirably be surrounded by the shields as thoroughly as possible so as not to cause deposits on the inner wall of the chamber.

When the processing space is surrounded by the shields, as shown in Patent Document 1, a gas introduced into the processing space is exhausted to the outside of the processing space through a gap between the shields or between the shield and another member.

Further, Patent Document 2 proposes that the shields are configured such that in a chamber, a shield space, which is formed by the shields, has a film-formation space surrounding a substrate holder and a movable-plate housing space in which a movable plate can be housed, and that two exhaust channels are provided for exhausting a gas from the shield space. Of these exhaust channels, a first exhaust channel is a gap provided between the substrate holder and the shield, and a second exhaust channel is an opening portion provided in the movable-plate housing space. The movable plate is movable between a position where the movable plate closes the opening portion (some clearance may exist between the movable place and the shield) and a position where the movable plate allows the opening portion so be open. When the movable plate is at the closing position, a gas introduced into the shield space is exhausted mostly from the gap, allowing a uniform film formation process on a surface of the substrate placed on the substrate holder. When the movable plate is at the opening position, exhaust conductance in the shield space is drastically increased compared to a state where the movable plate is at the closing position, and consequently, residual gas in the shield space can be exhausted efficiently.

CITATION LIST

Patent Document

Patent Document 1: Japanese Patent Application Publication No. Hei 5-247639
Patent Document 2: Japanese Patent Application Publication No. 2011-132580
Patent Document 3: Japanese Patent Application Publication No. 2010-251604
Patent Document 4: Japanese Parent Application Publication No. Hei 5-117867

SUMMARY OF INVENTION

It is known that, in the substrate processing under vacuum, the flow rate of a gas introduced to the processing space largely affects processing properties or the substrate, as shown in Patent Documents 3 and 4.

Meanwhile, pressure in the processing space can also affect other processing properties of the substrate. For this reason, when the flow rate of a gas introduced to the processing space is determined to obtain desired processing properties, the pressure in the processing space needs to be adjusted within an appropriate range according to the flow rate determined.

To deal with this problem, it is conceivable to adjust a gap between the shields or a gap between the shield and another member in order to adjust the amount of a gas exhausted from the processing space to an outside space which is other than the processing space (also referred to simply as an outside space hereinbelow). However, it is very cumbersome to design the gap between members such as the shields each time according to the substrate processing to carry out. Moreover, too large gap increases the amount of deposits generated onto the inner wall of the chamber.

A technique disclosed in Patent Document 2 is effective because ft can improve the exhaust conductance inside the shield space without using a complicated mechanism and can therefore efficiently exhaust the residual gas inside the shield space. However, there remain problems to be solved. Particularly when the movable plate is at the opening position during exhaust of residual gas inside the shield space, particles dispersed from the film-forming space (e.g., sputtered particles) move outside the shield space through the opening portion being the second exhaust channel. This increases the amount of particles attached to the inner wail of the chamber. In other words, even though the shields are provided, particles might be attached to the inner wall of the chamber.

The present invention has been made to solve the above problems, and has an objective of providing a substrate processing apparatus capable of reducing attachment of particles generated inside a processing space (e.g., sputtered particles) to an inner wall of a chamber in which the processing space is formed, and also capable of easily adjusting pressure in the processing space while introducing a gas into the processing space at a predetermined flow rate.

One aspect of the present invention is a substrate processing apparatus including: a container in which a substrate is processed; a gas exhaust portion configured to exhaust a gas in the container; a substrate holder provided inside the container and configured to retain the substrate; a shield provided to surround the substrate holder and dividing an inside of the container into a processing space where the substrate is processed and an outside space which is other than the processing space; a gas introducing portion configured to introduce a gas into the processing space; a plasma generating portion configured to generate plasma inside the processing space; and an exhaust portion provided to the shield, configured to allow the gas to be exhausted therethrough from the processing space to the outside space, and having a communication path through which the processing space and the outside space communicate, wherein at least part of the communication path is hidden from a region in the processing space where the plasma generating portion generates the plasma.

The present invention makes it possible to reduce attachment of particles generated in a processing space to an inner wall of a chamber in which the processing space is formed, and to easily adjust pressure in the substrate processing space while introducing a gas into the substrate processing space at a desired flow race.

BRIEF DESCRIPTION OF DRAWINGS

FIG. 9 is a diagram illustrating an exhaust portion according to a fifth embodiment of the present invention.

FIG. 14 is a diagram illustrating the exhaust portion according to the sixth embodiment of the present invention.

FIG. 15 is a diagram illustrating an exhaust portion according to a seventh embodiment of the present invention.

DESCRIPTION OF EMBODIMENTS

Figure 1:
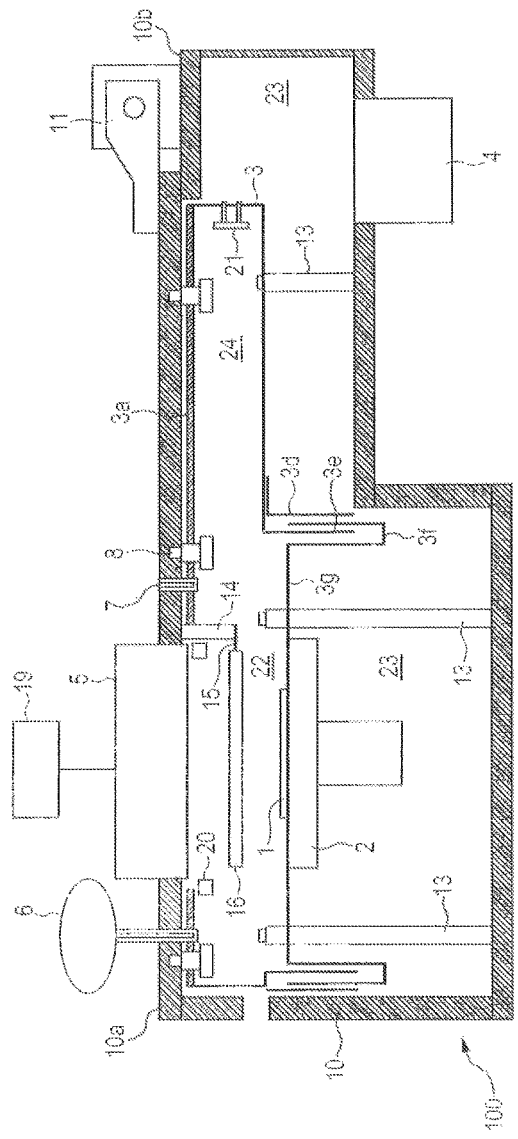
FIG. 1 is a diagram illustrating an example of a substrate processing apparatus according to the present invention.

Embodiments of the present invention are described below with reference to the drawings. It should be noted that the present invention is not limited to these embodiments, and can be appropriately changed without departing from the gist thereof. Moreover, throughout the drawings to be described below, elements having the same function are denoted by the same reference numeral, and may not be repeatedly described. To facilitate an understanding of the invention, the drawings may omit reference numerals for elements already described.

First Embodiment

FIG. 1 shows a sputtering apparatus as one embodiment of a vacuum processing apparatus (substrate processing apparatus) according to the present invention. FIG. 1 is an overall schematic diagram of a sputtering apparatus 100.

As shown in FIG. 1, the sputtering apparatus 100 has a chamber 10 as a vacuum container, a chamber ceiling wall 10b, a chamber top lid 10a, and a hinge portion 11. The chamber 10 can be opened by the top lid 10a attached to the hinge portion 11, exposing an internal space thereof. The chamber 10 includes a target, holder 5 configured to retain a target, and an exhaust portion 4, such as a vacuum pump, configured to exhaust a gas in the chamber 10. The target holder 5 is connected to a voltage applying portion 19, and functions as a cathode. Around the target holder 5 as a cathode, a target ring 20 is provided as an anode, surrounding a target retained on the target holder 5 (a target retaining surface). The target ring 20 is grounded. With such a configuration, when the voltage applying portion 19 applies a predetermined voltage to the target holder 5, electrical discharge occurs in the vicinity of the target to generate plasma there. Thereby, the target can be sputtered. Multiple target holders 5 may be provided. A substrate holder 2 on which a substrate 1 is to be placed is provided at a position facing the target holder 5. The substrate holder 2 may be configured to be rotatable in an in-plane direction of the substrate 1, or to be movable in a direction perpendicular to the substrate 1. A shutter 16 is provided above a substrate-placing surface of the substrate holder 2, and is configured to shield the substrate 1 from the target. The shutter 16 is movable by use of an arm 15 and can be moved between a shielding position at which the shutter 16 shields the substrate 1 from the target holder 5 (target) and a retreat position at which the shutter 16 makes the substrate 1 exposed to the target holder 5 (target). A shutter opening/closing driving portion 14 is affixed to the top lid 10a.

Multiple shields 3 configured to prevent or reduce attachment of film to an inner wall of the chamber 10 are provided around the substrate holder 2. These shields 3 divide the inside of the chamber 10 into a processing space 22 where plasma is generated surd an outside space 23 which is inside the chamber 10 but outside the processing space 22. In this embodiment, a retreat space 24 for the shutter 10 where a retreat position of the shutter 16 is set is also defined by the shields 3, and is part of the processing space 22. Since the retreat space 24 is defined by the shields 3 and allows the shutter 16 to be accommodated thereinside, a portion of the shields 3 forming the retreat space 24 can also be said to be a shutter retreat chamber.

The shields 3 are made of stainless steel or the like, and configured to be attachable to the inside of the chamber 10 by screws or the like so that they can be periodically replaced. A gas introduction pipe 7 penetrating the top lid 10a and a ceiling shield 3a is provided to introduce a process gas, such as an argon gas, into the processing space 22. A process gas is introduced to the processing space 22 through the gas introducing pipe 7. In addition, a pressure gauge 6 is provided to measure the pressure in the processing space 22. The shields 3 are supported by a support member 13.

The ceiling shield 3a is provided at the top lid 10a by being supported with fixation bolts 8. An annular shield 3g is fixedly provided around the substrate holder 2. Further, a shield 3d, a shield 3e, and a shield 3f are provided outside of an outer edge portion of the annular shield 3g. Once attached, the shield 3d, the shield 3e, and the shield 3f have predetermined gaps therebetween and form a labyrinth. The processing space 22 and the outside space 23 communicate through this labyrinth structure.

A first exhaust portion 21 according to the present invention is provided at the shield 3 defining the retreat space 24 for the shutter 10 (the shutter retreat chamber), the first exhaust portion 21 being configured to exhaust a gas in the processing space 22 to the outside space 23. The exhaust portion 21 is configured such that at least part of a communication path through which the retreat space 24 and the outside space 23 communicate (an exhaust channel) is provided at a position hidden from the space inside the processing space 22 where plasma is generated (a plasma generated space). A gas is exhausted to the outside space 23 through the communication path. Preferably, the exhaust portion 21 is configured in such a manner as to be able to adjust a flow rate of a gas exhausted from the processing space 22 to the outside space 23 through the exhaust portion 21. Allowing a gas in the processing space 22 to be exhausted from the processing space 22 to the outside space 23, the labyrinth structure described above functions as a second exhaust portion configured to exhaust a gas in the processing space 22 to the outside space 23.

One of the characteristics of the present invention lies in that the present invention reduces release of sputtered particles, generated by sputtering, to the outside space 23 to be attached to the inner wall of she chamber 10. Thus, it is desirable that at least part of a communication path of the exhaust portion 21 described above should be hidden from a place where the sputtered particles are generated or a place where a large amount of sputtered particles are flying. Such places include a space between the target holder 5 and the substrate holder 2. Hence, from a different perspective, in this embodiment, at least part of the communication path is provided at a position hidden from the space between the target holder 5 and the substrate holder 2.

In this embodiment, the exhaust channel is provided such that a distance between the exhaust portion 21 and a gas introducing portion where the gas introducing pipe 7 is connected to the chamber 10 is larger than a distance between the exhaust portion 21 and a gas exhaust portion where the exhaust portion 4 is connected, to the chamber 10. For this reason, a gas introduced into the processing space 22 passes through the exhaust portion 21 after being sufficiently diffused and is then exhausted by she exhaust portion 4. This allows suppression of uneven processing on the substrate surface.

The exhaust portion 21 is desirably provided outside the plasma region formed by the target holder (cathode) 5, the voltage applying portion 19, and the target ring (anode) 20. Being provided outside the plasma region allows prevention or suppression of film deposition on or plasma leak to the exhaust portion 21.

Figure 2A:
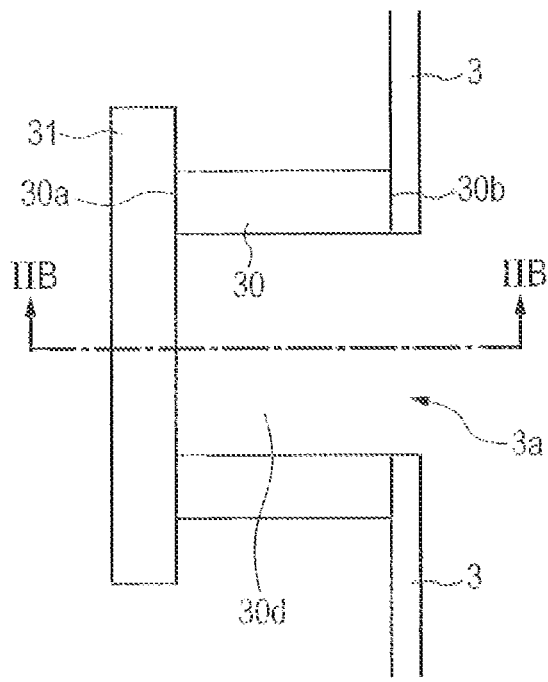
FIG. 2A is a diagram illustrating an exhaust portion according to a first embodiment of the present invention.
Figure 2B:
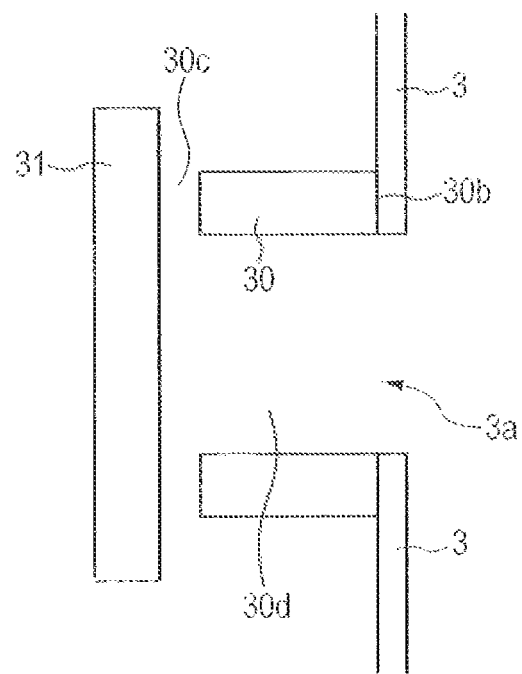
FIG. 2B is a sectional view taken along arrowed line IIB-IIB in FIG. 2A.

A description of the exhaust portion 21 is described below with reference to FIGS. 2A and 2B. FIGS. 2A and 2B are diagrams showing an enlargement of the exhaust portion 21. FIG. 2A is a diagram showing an enlargement of the exhaust portion 21 in the cross-sectional view of the sputtering apparatus 100 in FIG. 1, and FIG. 2B shows a sectional view taken along arrowed line IIB-IIB in FIG. 2A.

The exhaust portion 21 includes: an opening portion 3a formed in the shield 3 defining the retreat space 24 to allow communication between the processing space 22 and the outside space 23; an annular first protruding portion 30 surrounding an outer circumference of the opening portion 3a (an edge portion of the opening portion 3a), extending from the edge portion of the opening portion 3a toward the processing space 22, and having one of its end surfaces, namely a surface 30b, contacting the edge portion of the opening portion 3a; a shade 31 provided to cover the opening portion 3a and connected to a contact surface 30a which is the other end surface of the first protruding portion 30 (an end opposite to the end on the shield 3 side, i.e., an end on the processing space 22 side); and notched portions 30c each formed in part of the other end of the first protruding portion 30. The shade 31 is affixed to the first protruding portion 30 with screws or the like such that the shade 31 comes into contact with the contact surface 30a of the first protruding portion 30. The first protruding portion 30 is affixed to the shield 3 with a screw or the like such that the surface 30b comes into contact with the shield 3.

As shown in FIG. 2B, the first protruding portion 30 is provided with the notched portions 30c, and the shade 31 is in contact with the contact surface 30a where the notched portions 30c are formed. Thus, the notched portions 30c each also serve as a gap between the first protruding portion 30 and the shade 31 (therefore the notched portion 30c is also called "a gap 30c"). Hence, the exhaust portion 21 has the gap 30c, which is hidden from the plasma generated space, in a region other than the portion where the first protruding portion 30 is affixed to the shade 31. The exhaust portion 21 thus has a configuration in which a gas can be exhausted through the gaps 30c formed between the first protruding portion 30 and the shade 31. The retreat space 24 (the processing space 22) and a hollow portion 30d of the first protruding portion 30 communicate through the gaps 30c, and the hollow portion 30d communicates with the opening portion 3a. Thus, the retreat space 24 (the processing space 22) and the outside space 23 communicate through the gaps 30c, the hollow portion 30d, and the opening portion 3a. In other words, the gaps 30c, the hollow portion 30d, and the opening portion 3a serve as the communication path described above. When the shade 31 covers not only the opening portion 3a of the shield 3, but also the first protruding portion 30 as shown in FIG. 2, flying of spattered particles to the outside space 23 can be further prevented or suppressed.

Figure 3:
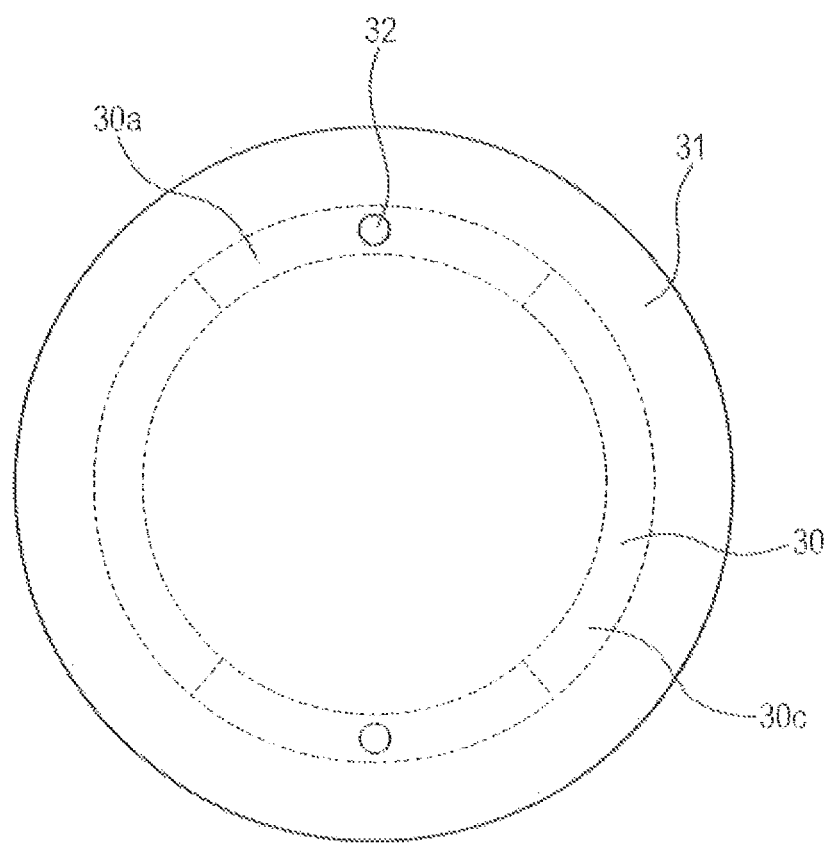
FIG. 3 is a diagram illustrating positional relations of components of the exhaust portion according to the first embodiment of the present invention.

FIG. 3 is a diagram showing the exhaust portion 21 from the processing space 22 side to illustrate positional relations of the members. The surface 30a of the first protruding portion 30 is in contact with the shade 31, and the shade 31 is affixed to the first protruding portion 30 with screws 32. It should be noted that an opening portion formed by the first protruding portion 30, i.e., an opening portion formed by the hollow portion 30d, does not necessarily have to be larger than the opening portion 3a formed in the shield 3. In other words, the exhaust amount can be controlled by making the opening portion formed by the hollow portion 30d smaller than the opening portion 3a.

Such a configuration allows prevention or suppression of plasma generated in the processing space 22 leaking from the processing space 22, and also allows reduction in sputtered particles leaking to the outside space 23 of the processing space 22 so be attached to the inner wall of the chamber 10.

Although the first protruding portion 30 and the shade 31 may be provided on either one of the processing space 22 side and the outside space 23 side of tire shield 3, providing them on the processing space 22 side allows more reduction in sputtered particles leaking to the outside space 23.

Figure 4A:
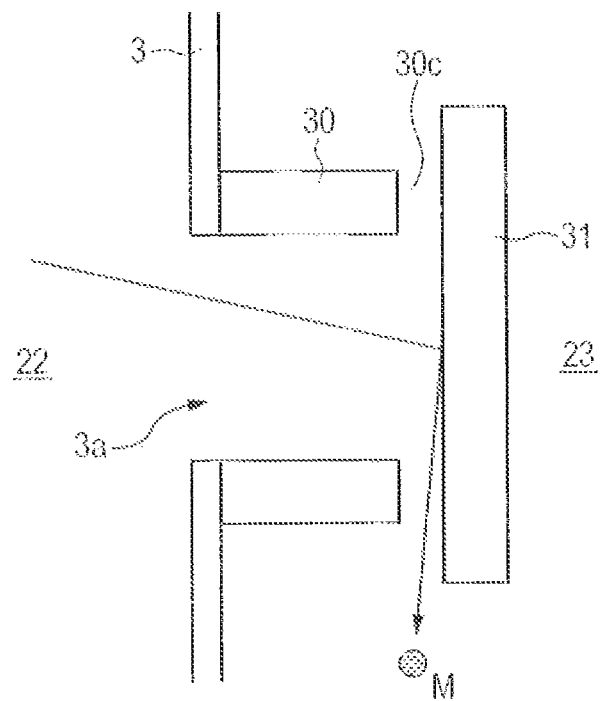
FIG. 4A is a diagram illustrating a configuration in which the exhaust portion according to the first embodiment of the present invention is located on the outside space side of a shield.
Figure 4B:
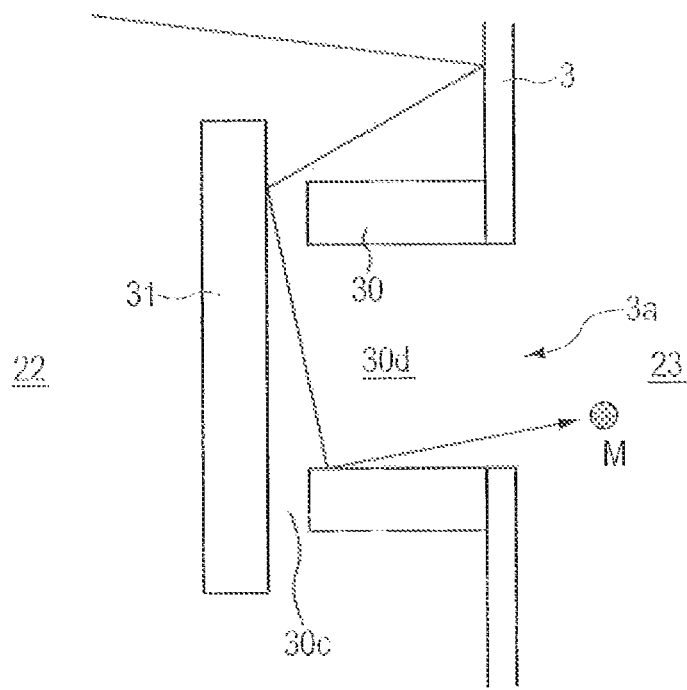
FIG. 4B is a diagram illustrating a configuration in which the exhaust portion according to the first embodiment of the present invention is located on the processing space side of the shield.

This point is described more concretely using FIGS. 4A and 4B.

FIG. 4A shows a case where the first protruding portion 30 and the shade 31 are provided on the outside space 23 side of the shield 3. FIG. 4B shows a case where the first protruding portion 30 and the shade 31 are provided on the processing space 22 side of the shield 3, as shown in FIG. 2.

In she case in FIG. 4A, each gap 30c being part of the communication path is hidden from the plasma generated space (which is, from a different perspective, space between the target holder 5 and the substrate bolder 2) by the shield 3 and the first protruding portion 30. In this case, a sputtered particle M flying to the exhaust portion 21 may collide with the shade 31, and leak to the outside space 23. In contrast, in the case in FIG. 4B, the entire communication path (the gap 30c, the hollow portion 30d, and the opening portion 3a) is hidden from the plasma generated space (which is, from a different perspective, space between the target holder 5 and the substrate holder 2). Thus, the sputtered particle M flying to the exhaust portion 21 cannot pass through the gap 30c between the shade 31 and the first protruding portion 30 unless it collides with the shield 3 at a certain angle of incidence. For this reason, sputtered particles leaking from the processing space 22 to the outside space 23 can be reduced. Further, since deposition of sputtered particles onto the gaps 30c between the shade 31 and the first protruding portion 30 can be reduced, the amount of exhaust is less likely to change even after prolonged sputtering.

As described above, providing the exhaust portion 21 on the processing space 22 side of the shield 3 (FIG. 4B) is preferable because it can reduce sputtered particles leaking to the outside space 23. However, providing the exhaust portion 21 on the outside space 23 side of the shield 3 (FIG. 4A) can also reduce sputtered particles leaking to the outside space 23. In FIG. 4A, as described above, the gap 30c being part of the communication path between the processing space 22 and the outside space 23 is provided at a position which cannot be seen from the plasma generated space. Thus, considerable reduction is achieved for a situation where the linearly-flying sputter particle M directly falls incident on the gap 30c. Further, out of sputtered particles reflected by the shade 31, while some fall incident on the gap 30c, most do not fall incident on the gap 30c but fly toward the processing space 22. Thus, by configuring the exhaust portion 21, as shown in FIGS. 4A and 4B, such that at least pare of the communication path is hidden from the plasma generated space in the processing space 22 (which is, from a different perspective, a region between the target holder 5 and the substrate holder 2), a linearly-flying sputtered particle can be shielded in a way by at least part of the communication path (the hidden portion described above). This allows reduction in sputtered particles leaking to the outside space 23.

Further, in this embodiment, the shade 31 functions as a screen portion against sputtered particles trying to leak from the processing space 22 to the outside space 23. The shade 31 as the screen portion can block sputtered particles linearly flying to the exhaust portion 21.

Second Embodiment

A second embodiment of the present invention is described next with reference to FIGS. 5A and 5B.

Figure 5A:
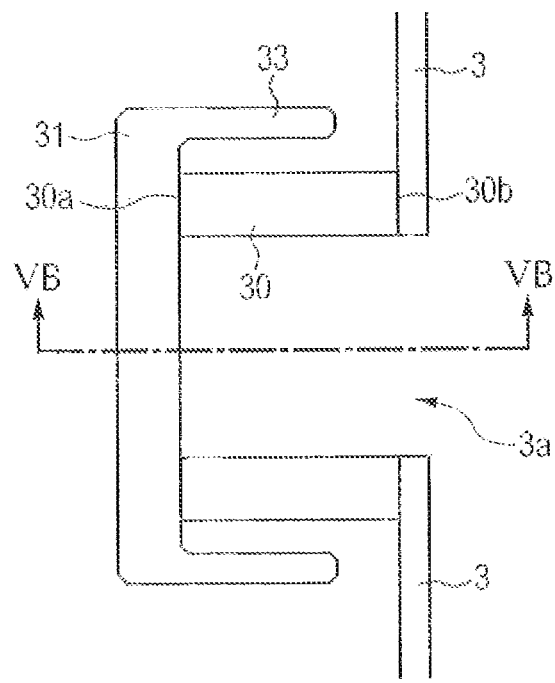
FIG. 5A is a diagram illustrating an exhaust portion according to a second embodiment of the present invention.
Figure 5B:
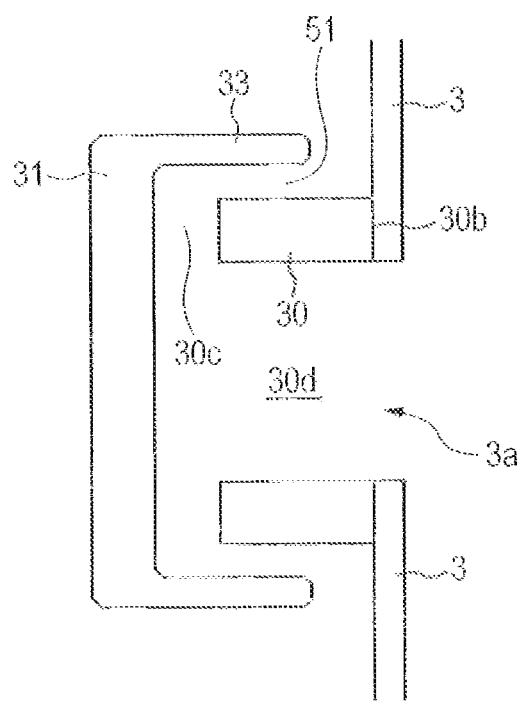
FIG. 5B is a sectional view taken along arrowed line VB-VB in FIG. 5A.

FIG. 5A is a diagram illustrating an exhaust portion 21 according to this embodiment, and FIG. 5B is a sectional view taken along arrowed line VB-VB in FIG. 5A.

In this embodiment, the shade 31 has a second protruding portion 33 at an outer circumferential portion thereof, the second protruding portion 33 protruding toward the shield 3. The second protruding portion 33 and the first protruding portion 30 hare a predetermined gap 51 therebetween, and the gap 51 and the gaps 30c communicate. Thus, in this embodiment, the communication path is constituted by the gap 51, the gaps 30c, the hollow portion 30d, and the opening portion 3a.

Figure 6:
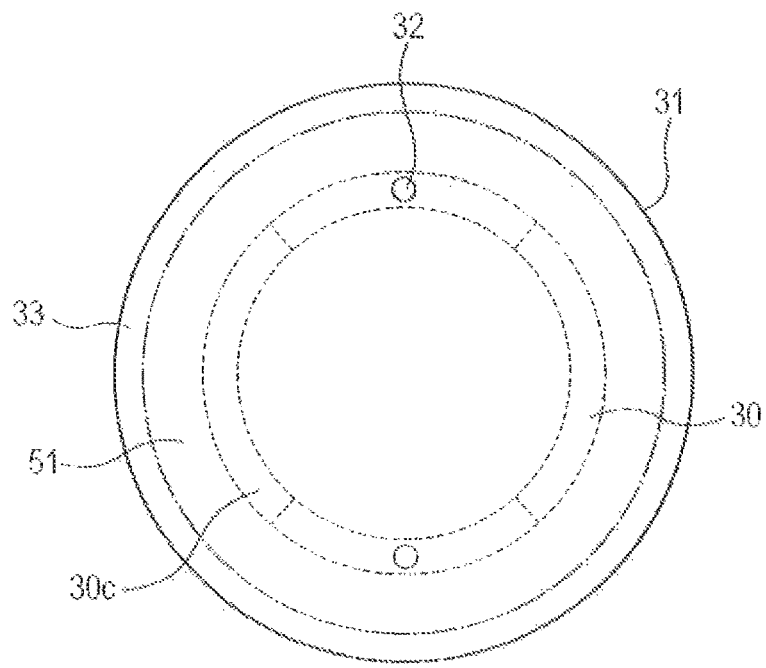
FIG. 6 is a diagram illustrating positional relations of components of the exhaust pore ion according to the second embodiment of the present invention.

FIG. 6 shows the exhaust portion 21 according to this embodiment from the processing space 22 side to illustrate positional relations of the members. The surface 30a of the first protruding portion 30 is in contact with the shade 31, and the shade 31 is affixed to the first protruding portion 30 with the screws 32. The second protruding portion 33 is substantially circular to match the outer circumferential shape of the first protruding portion 30. Thereby, the gap 51 formed between the first protruding portion 30 and the second protruding portion 33 is substantially uniform throughout.

Third Embodiment

Figure 7:
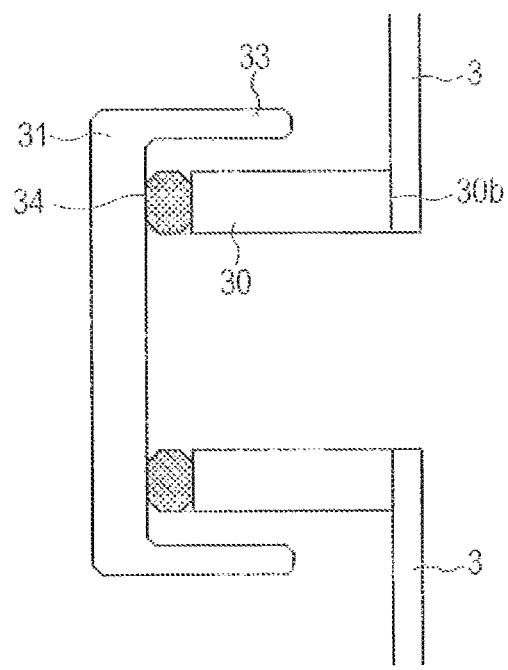
FIG. 7 is a diagram illustrating an exhaust portion according to a third embodiment of the present invention.

A third embodiment is described next with reference to FIG. 7.

In this embodiment, the first protruding portion 30 and the shade 31 are not in contact, and insertion members 34 are inserted between the first protruding portion 30 and the shade 31. The first protruding portion 30 is uniform in height throughout, unlike the embodiments described above. By the insertion members 34 placed at affixed portions between the first protruding portion 30 and the shade 31, gaps are formed at portions other than the affixed portions. As tire insertion member 34, anything functioning as a spacer, such as a washer for example, can be used. In this embodiment, the insertion member 34 is a spacer configured to be able to change the position of the shade 31 relative to the first protruding portion 30. Such a spacer includes a washer.

In this embodiment, by using a washer as the insertion member 34, when the shade 31 is to be affixed to the first protruding portion 30 with the screws 32, the shade 31 can be fixed at any position relative to the first protruding portion 30. Thus, the height of the shade 31 is made variable in a direction in which the first protruding portion 30 extends. In other words, according to this embodiment, the gaps between the first protruding portion 30 and the shade 31 can be adjusted according to processing conditions of the substrate without specially defining the height of the contact surface 30a between the first protruding portion 30 and the shade 31. Thus, the amount of a gas exhausted from the processing space 22 can be adjusted to a desired value. It is of course possible to place the insertion members 34 between the shade 31 and the first protruding portion 30 in the first and second embodiments described above.

Fourth Embodiment

Figure 8A:
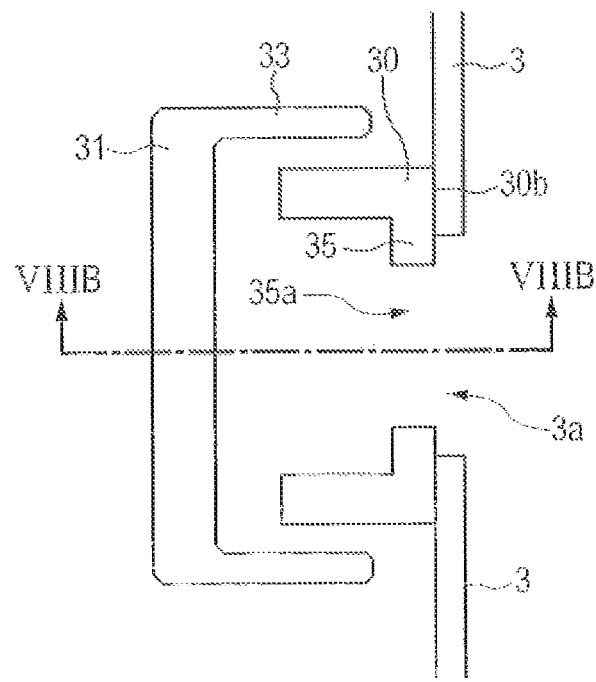
FIG. 8A is a diagram illustrating an exhaust portion according to a fourth embodiment of the present invention.
Figure 8B:
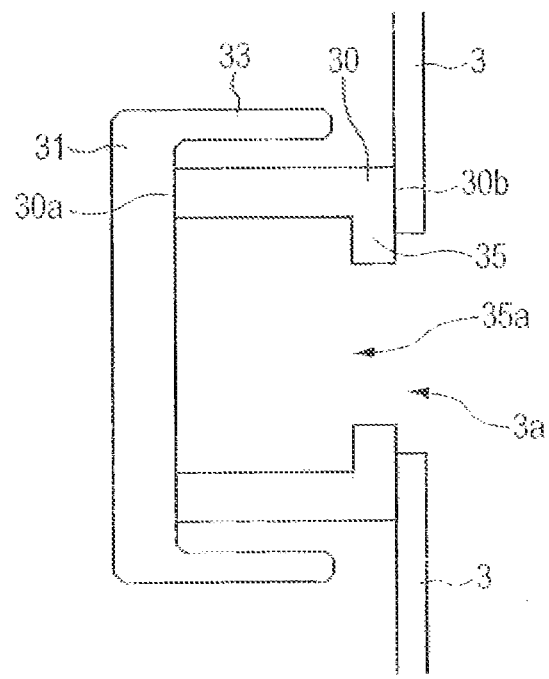
FIG. 8B is a sectional view taken along arrowed line VIIIB-VIIIB in FIG. 8A.

A fourth embodiment of the present invention is described next with, reference to FIG. 8.

In this embodiment, in addition to the embodiments described above, the first protruding portion 30 has a third protruding portion 35 extending in a direction horizontal, to the shield 3. Note that the direction horizontal to the shield 3 means to be substantially horizontal to the plane of the shield 3 to which the first protruding portion 30 is attached. As shown in the first embodiment, the shade 31 and the first protruding portion 30 axe affixed to each other at the contact surface 30a between the shade 31 and the first protruding portion 30. Note that the third protruding portion 35 may be formed separately from the first protruding portion 30, or may be formed integrally with the first protruding portion 30.

According to this embodiment, irrespective of the size of the opening port ton 3a of the shield 3, an opening portion 35a formed by the third protruding portion 35 can decrease or increase the opening area of an out side-space-23-side opening portion of the communication path between the processing space 22 and the outside space 23. In other words, the amount of exhaust can be controlled by adjustment of the inner diameter of the third protruding portion 35. Note that the height of the third protruding portion 35 means the height of the third protruding portion from the first protruding portion 30 (height in the protruding direction, i.e., the length in the horizontal direction mentioned above).

Fifth Embodiment

A fifth embodiment of the present invention is described next with reference to FIGS. 9, 10, and 11.

In this embodiment, in addition to the embodiments described above, an exhaust amount controller is provided at a back surface of the exhaust portion 21. The exhaust amount controller includes: a restrictor 36 in contact with the shield 3 or the third protruding portion 35 in such a manner as to plug the opening portion 3a of the shield 3 or the opening portion 35a formed by the third protruding portion 35; a bar 37 as a support portion configured to support the restrictor 36; and a controller 39 configured to control movement of the restrictor 36. In this embodiment, the restrictor 36 is configured to decrease the opening area of the opening portion 35a when at least part of the restrictor 36 is inserted into the opening portion 3a and the opening portion 35a, the opening area being reduced compared to that when the restrictor 36 is not inserted. Specifically, the restrictor 36 has a projecting portion 36a and a base portion 36b having a diameter larger than those of the projecting portion 36a and the opening portion 35a and smaller than that of the opening portion 3a. When the projecting portion 36a is inserted into the opening portion 3a and the opening portion 35a, the opening area of the opening portion 35a is restricted, the opening portion 35a being part of the communication path between the processing space 22 and the outside space 23. The diameter of the projecting portion 36a. is smaller than that of the opening portion 35a. Thus, when the projecting portion 36a is inserted into the opening portion 35a, a gap 36c is formed between a side wall of the projecting portion 36a and the opening portion 35a.

The restrictor 36 is connected to the bar 37, and thereby connected to the controller (movement controller) 39 provided on the atmosphere side through the chamber 10 and configured to move the restrictor 36 in a direction normal to the plane of the shield 3 where the exhaust portion 21 is provided (a direction normal to the plane of the opening portion 3a). The controller 39 includes a handle 40, and by manipulation of the handle 40, the position of the restrictor 36 can be changed. Bellows 38 are provided between the controller 39 and the chamber 10 to maintain vacuum inside the chamber 10.

Figure 10:
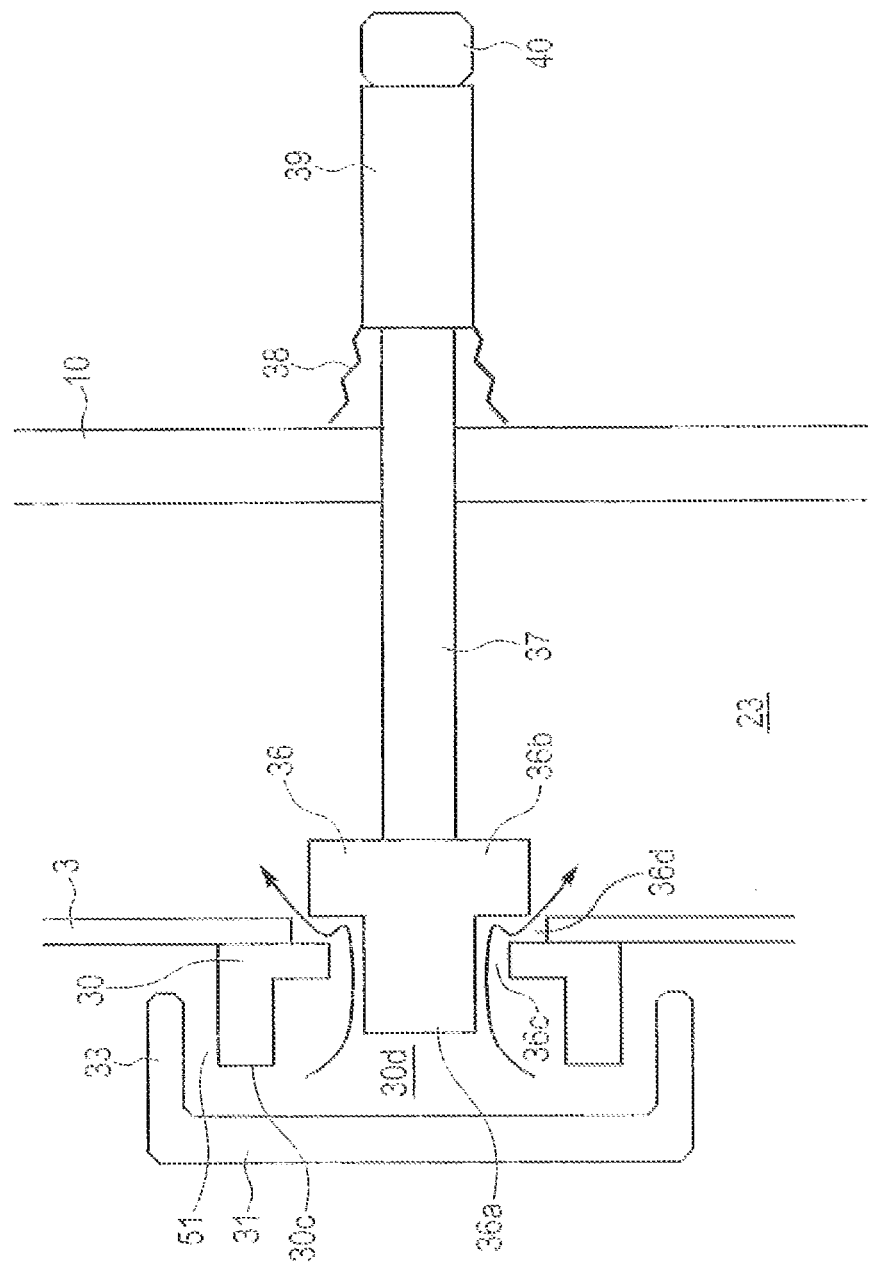
FIG. 10 is a diagram illustrating the exhaust portion according to the fifth embodiment of the present invention.
Figure 11:
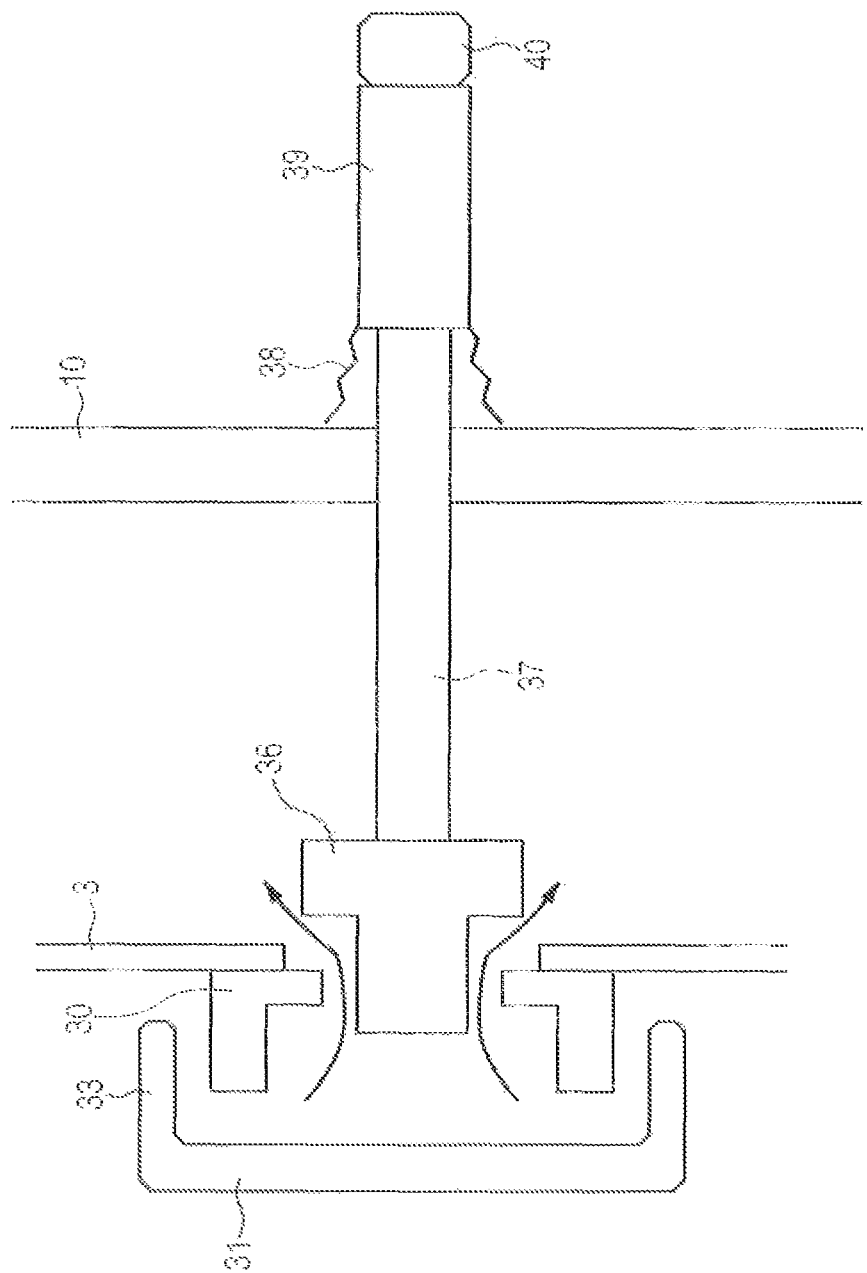
FIG. 11 is a diagram illustrating the exhaust portion according to the fifth embodiment of the present invention.

As shown in FIGS. 9 to 11, by operating the controller 39, a gap between the restrictor 36 and the third protruding portion 35 van be changed to thereby control the amount of exhaust. For example, as shown in FIG. 9, when the base portion 36b is brought into contact with the third protruding portion 35 (i.e., the base portion 36b is brought into contact with an edge portion of the opening portion 35a being part of the communication path), the opening portion 35a being part of the communication path is plugged by the base portion 36b. Thus, the restrictor 36 restricts exhaust through the exhaust portion 21. Next, as shown in FIG. 10, the controller 39 controls to move the restrictor 36 such that the base portion 36b moves away from the third protruding portion 35, and then a gap 36d is generated between the base portion 36b and the third protruding portion 35, opening the communication path whose part described above was plugged. In this event, a gas inside the processing space 22 is released to the outside space 23 via the gap 51, the gaps 30c, the hollow portion 30d, the gap 36c, and the gap 36d. Hence, in this embodiment, the gap 51, the gaps 30c, the hollow portion 30d, the gap 36c, and the gap 36d serve as the communication path from the processing space 22 to the outside space 23. Further, as shown in FIG. 11, when the base portion 36b is moved further away from the third protruding portion 35, the exhaust conductance of the exhaust portion 21 can be increased compared to that in FIG. 10. In this way, the size of as least the gap 36d can be changed depending on the inserted position of the restrictor 36, and consequently the exhaust conductance of the exhaust portion 21 can be changed.

The exhaust portion 21 according to one embodiment of the present invention is provided to the shield which is generally a reusable part. Thus, after the shield is subjected to a reuse process, the sizes of the gaps formed by the shade 31, the second protruding portion 33, and the first protruding portion 30 possibly change. By using the invention according to this embodiment, even if the amount of exhaust changes as a result of the reuse process, the change can be adjusted by changing the position of the restrictor 36. Note that, as described in the first embodiment, when the opening portion formed by the first protruding portion 30 is smaller than the opening portion 3a of the shield 3, the restrictor 36 may be brought into contact with the first protruding portion 30.

Sixth Embodiment

Figure 12:
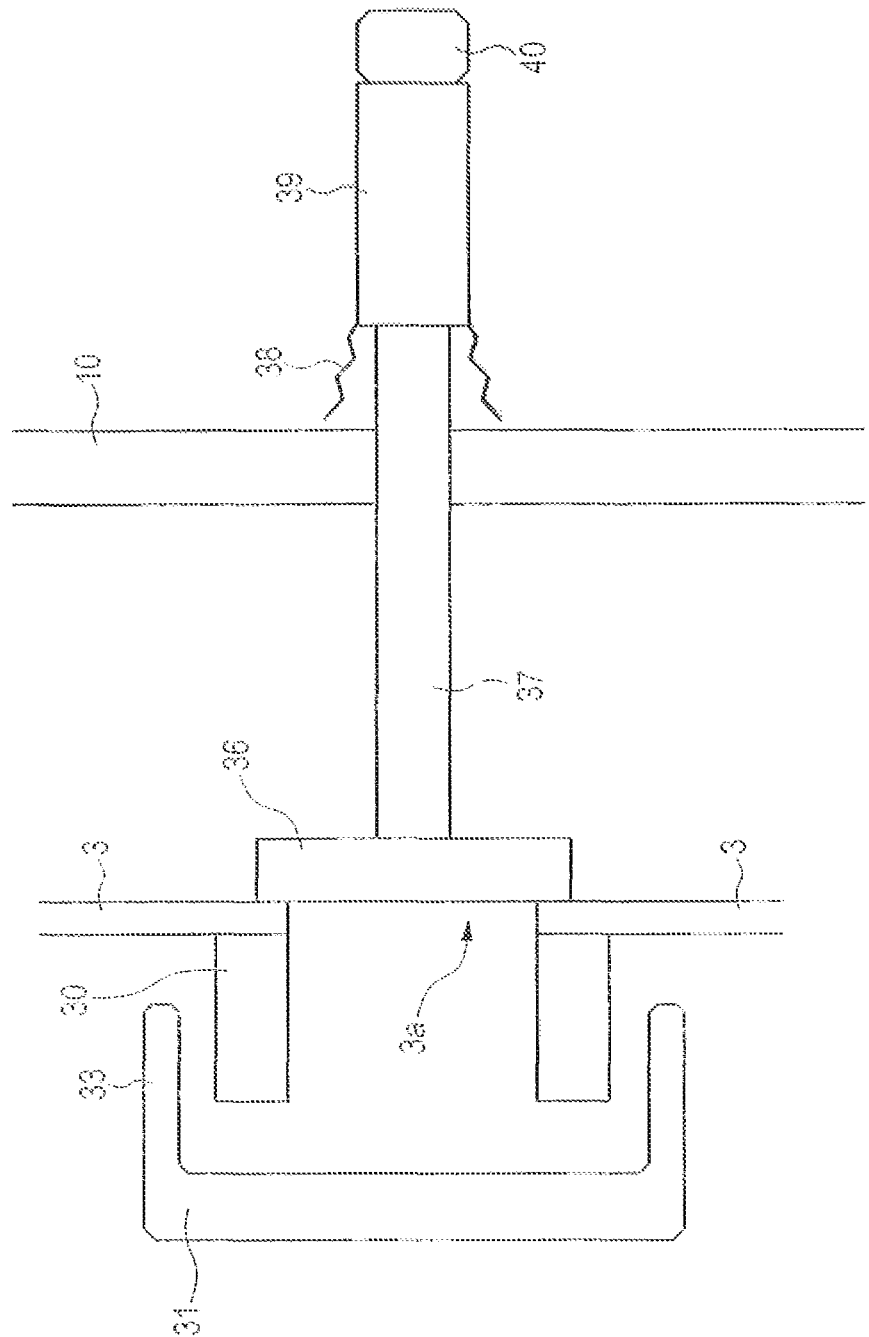
FIG. 12 is a diagram illustrating an exhaust portion according to a sixth embodiment of the present invention.
Figure 13:
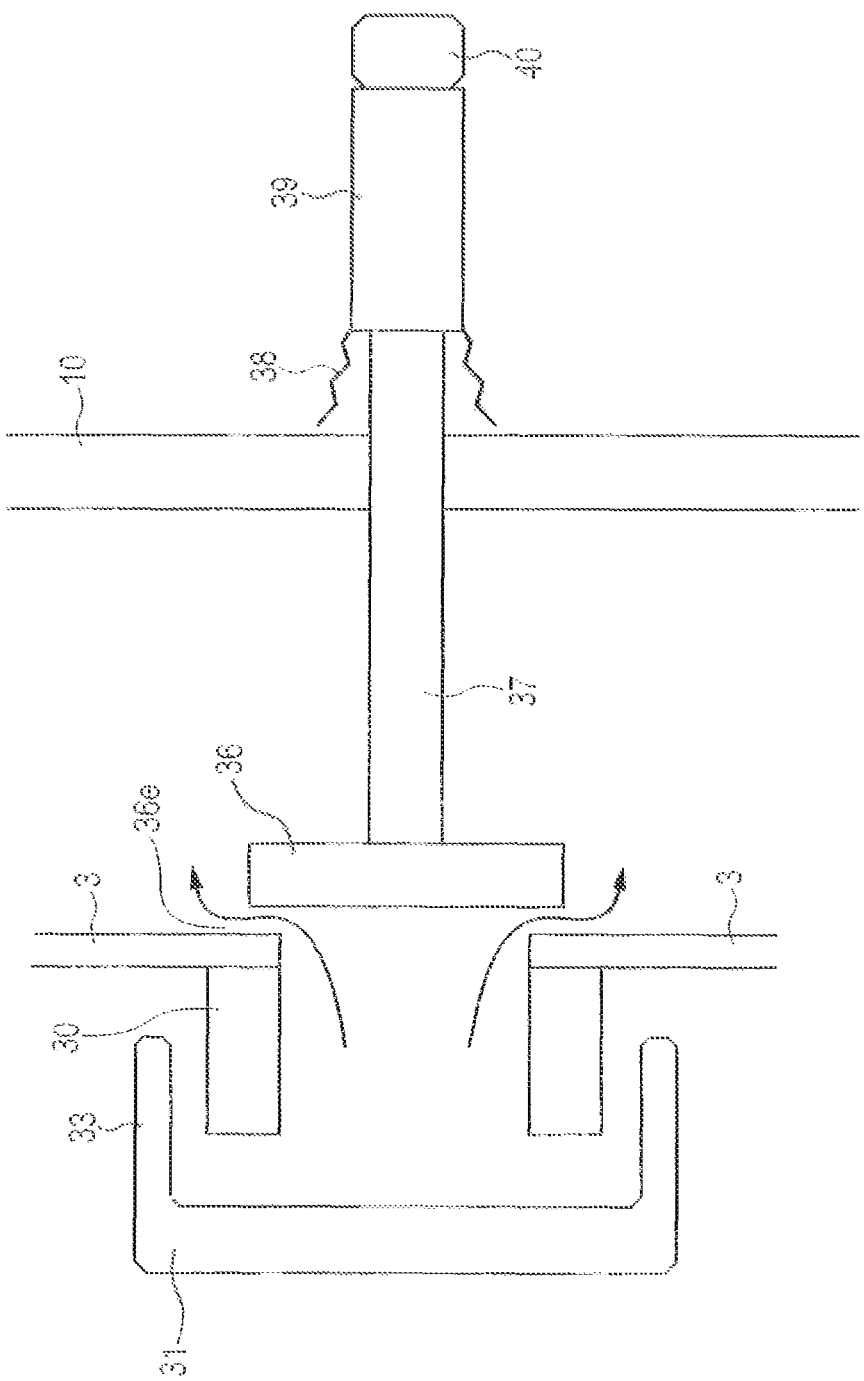
FIG. 13 is a diagram illustrating the exhaust portion according to the sixth embodiment of the present invention.

A sixth embodiment of the present invention is described next with reference to FIGS. 12, 13, and 14.

In this embodiment, the restrictor 36 has a different shape from that in the fifth embodiment described above. The restrictor 36 according to this embodiment has a shape obtained by excluding the projecting portion 36a from the restrictor 36 of the fifth embodiment. The restrictor 36 of this embodiment includes a tip end having a sectional area larger than an opening area of the opening portion 3a formed in the shield 3. In other words, the diameter of a portion of the restrictor 36 in contact with the shield 3 is larger than the diameter of the opening portion 3a. In this way, as shown in FIG. 12, the restrictor 36 is configured to plug the opening portion 3a by coming into contact with the shield 3. Specifically, the restrictor 36 restricts a gas exhausted from the processing space 22 to the outside space 23 by coming into contact with the shield 3 (by coming into contact with an edge portion of the opening portion 3a being part of the communication path through which the processing space 22 and the outside space communicate 23). On the other hand, as shown in FIGS. 13 and 14, when the restrictor 36 is moved away from the shield 3, a gap 36e is formed between the restrictor 36 and the shield 3. By the controller 39 adjusting this gap 36e between the restrictor 36 and the shield 3, the exhaust conductance in the exhaust portion 21 can be adjusted, and also the flow rate of a gas exhausted can be adjusted.

Seventh Embodiment

A seventh embodiment of the present invention is described next with reference to FIG. 15.

In this embodiment, in addition to the fifth embodiment, a support mechanism configured to support the exhaust, amount controller is provided. The support mechanism has a guide 41, a first support bar 42, and a second support bar 43. The guide 41 is affixed to the chamber 10. The first support bar 42 and the second support bar 43 support the bar 37 to prevent or suppress lowering of the bar 37 said the restrictor 36 due to their weights. The first support bar 42 and the second support bar 43 are attached to the bar 37 such that the first support bar 42 and the second support bar 43 are slidable relative to the bar 37. The bar 37 may be supported by only the first support bar 42 provided on the restrictor 36 side, but also providing the second support bar on the chamber 10 enables more stable support of the restrictor 30. In this embodiment, the support mechanism is particularly effective since the restrictor 36 and the controller 39 provided outside the chamber 10 are distanced away from each other.

The invention claimed is:

1. A substrate processing apparatus comprising:
a container in which a substrate is processed;
a first exhaust portion configured to exhaust a gas in the container;
a substrate holder provided inside the container and configured to retain the substrate;
a shield provided to surround the substrate holder and dividing an inside of the container into a processing space where the substrate is processed and an outside space which is other than the processing space, the shield having a plurality of shields;
a gas introducing portion configured to introduce a gas into the processing space;
a plasma generating portion configured to generate plasma inside the processing space;
a second exhaust portion provided to the shield, configured to allow the gas to be exhausted therethrough from the processing space to the outside space, and having a communication path through which the processing space and the outside space communicate, wherein at least a part of the communication path is hidden from a region in the processing space where the plasma generating portion generates the plasma; and
a third exhaust portion provided separately from the second exhaust portion to allow the gas to be exhausted from the processing space to the outside space through at least one gap formed by at least part of the plurality of shields,
wherein the second exhaust portion includes:
an opening portion formed in the shield;
a first protruding portion provided around the opening portion;
a screen portion provided at the first protruding portion at a side opposite from a side at which the shield is provided, and covering the opening portion; and
a gap that is adjustable and is provided between the first protruding portion and the screen portion and hidden from the region where the plasma generating portion generates the plasma, and
wherein the screen portion has a second protruding portion protruding toward the shield, and
wherein a gap is provided between the first protruding portion and the second protruding portion.

2. The substrate processing apparatus according to claim 1, wherein the first protruding portion and the screen portion are placed on a processing-space side, and the screen portion covers the first protruding portion entirely.

3. The substrate processing apparatus according to claim 1, wherein an insertion member is inserted between the screen portion and the first protruding portion, the insertion member being configured to adjust the gap provided between the first protruding portion and the screen portion.

4. The substrate processing apparatus according to claim 1, wherein the first protruding portion has a third protruding portion to decrease an opening area of the opening portion.

5. The substrate processing apparatus according to claim 1, wherein the second exhaust portion further has an exhaust amount controller, and
wherein the exhaust amount controller includes:
a restrictor having a projecting portion and configured to restrict an opening area of a part of the communication path when the projecting portion thereof is inserted into the opening portion;
a support portion connected to the restrictor and configured to support the restrictor; and
a movement controller provided outside the container, connected to the support portion, and configured to move the support portion such that the restrictor moves in a direction normal to a plane of the opening portion.

6. The substrate processing apparatus according to claim 5, wherein the exhaust amount controller further includes a support mechanism, and
wherein the support mechanism includes:
a guide horizontal to the support portion; and
a support bar affixed to the guide, provided in such a manner as to be slidable relative to the support portion, and configured to support the support portion.

7. The substrate processing apparatus according to claim 1, wherein the second exhaust portion further includes an exhaust amount controller, and
wherein the exhaust amount controller includes:
a restrictor configured to restrict exhaust of the gas from the processing space to the outside space by bringing a tip end thereof into contact with an edge portion of the opening portion, the tip end having a sectional area larger than an opening area of the opening portion;
a support portion connected to the restrictor and configured to support the restrictor; and
a movement controller provided outside the container, connected to the support portion, and configured to move the support portion such that the restrictor in contact with the edge portion moves away from the edge portion.

8. The substrate processing apparatus according to claim 7, wherein the exhaust amount controller further includes a support mechanism, and
wherein the support mechanism includes:
a guide horizontal to the support portion, and
a support bar affixed to the guide, provided in such a manner as to be slidable relative to the support portion, and configured to support the support portion.

9. The substrate processing apparatus according to claim 1, wherein the second exhaust portion is provided at a position which makes a distance between the gas introducing portion and the second exhaust portion larger than a distance between the first exhaust portion and the second exhaust portion.

10. A substrate processing apparatus comprising:
a container in which a substrate is processed;
a first exhaust portion configured to exhaust a gas in the container;
a substrate holder provided inside the container and configured to retain the substrate;
a shield provided to surround the substrate holder and dividing an inside of the container into a processing space where the substrate is processed and an outside space which is other than the processing space;

a gas introducing portion configured to introduce a gas into the processing space;

a plasma generating portion configured to generate plasma inside the processing space; and a second exhaust portion provided to the shield, configured to allow the gas to be exhausted therethrough from the processing space to the outside space, the second exhaust portion including:

an opening portion formed in the shield;

a first protruding portion provided around the opening portion so as to surround the opening portion, and including a notched portion at a part of an end portion thereof at a side opposite from the opening portion; and a screen portion covering the opening portion, wherein the screen portion is connected to the end portion.

11. The substrate processing apparatus according to claim 10, wherein the first protruding portion and the screen portion are placed on a processing-space side.

12. The substrate processing apparatus according to claim 11, wherein the screen portion covers the first protruding portion entirely, and wherein an insertion member is inserted between the screen portion and the end portion, the insertion member being configured to adjust a gap provided between the screen portion and the first protruding portion.

13. The substrate processing apparatus according to claim 10, wherein the first protruding portion has a third protruding portion to decrease an opening area of the opening portion.

14. The substrate processing apparatus according to claim 10, wherein the second exhaust portion further includes an exhaust amount controller, and wherein the exhaust amount controller includes:

a restrictor having a projecting portion and configured to restrict an opening area of the opening portion when the projecting portion thereof is inserted into the opening portion;

a support portion connected to the restrictor and configured to support the restrictor; and a movement controller provided outside the container, connected to the support portion, and configured to move the support portion such that the restrictor moves in a direction normal to a plane of the opening portion.

15. The substrate processing apparatus according to claim 10, wherein the second exhaust portion further includes an exhaust amount controller, and wherein the exhaust amount controller includes:

a restrictor configured to restrict exhaust of the gas from the processing space to the outside space by bringing a tip end thereof into contact with an edge portion of the opening portion, the tip end having a sectional area larger than an opening area of the opening portion;

a support portion connected to the restrictor and configured to support the restrictor; and a movement controller provided outside the container, connected to the support portion, and configured to move the support portion such that the restrictor in contact with the edge portion moves away from the edge portion.

16. The substrate processing apparatus according to claim 14, wherein the exhaust amount controller further includes a support mechanism, and wherein the support mechanism includes:

a guide horizontal to the support portion; and a support bar affixed to the guide, provided in such a manner as to be slidable relative to the support portion, and configured to support the support portion.

17. The substrate processing apparatus according to claim 15, wherein the exhaust amount controller further includes a support mechanism, and wherein the support mechanism includes:

a guide horizontal to the support portion; and a support bar affixed to the guide, provided in such a manner as to be slidable relative to the support portion, and configured to support the support portion.

18. The substrate processing apparatus according to claim 10, wherein the shield has a plurality of shields, and wherein the substrate processing apparatus further comprises a third exhaust portion provided separately from the second exhaust portion to allow the gas to be exhausted from the processing space to the outside space through at least one gap formed by at least part of the plurality of shields.

19. The substrate processing apparatus according to claim 10, wherein the second exhaust portion is provided at a position which makes a distance between the gas introducing portion and the second exhaust portion larger than a distance between the first exhaust portion and the second exhaust portion.

* * * * *